United States Patent
Ayotte et al.

(10) Patent No.: US 9,059,097 B2
(45) Date of Patent: Jun. 16, 2015

(54) INHIBITING PROPAGATION OF IMPERFECTIONS IN SEMICONDUCTOR DEVICES

(75) Inventors: Stephen P. Ayotte, Bristol, VT (US); David J. Hill, Richmond, VT (US); Glen E. Richard, Essex Junction, VT (US); Timothy M. Sullivan, Essex Junction, VT (US); Heather M. Truax, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 283 days.

(21) Appl. No.: 13/570,426

(22) Filed: Aug. 9, 2012

(65) Prior Publication Data

US 2014/0042594 A1 Feb. 13, 2014

(51) Int. Cl.
| | |
|---|---|
| H01L 21/00 | (2006.01) |
| H01L 21/469 | (2006.01) |
| H01L 21/302 | (2006.01) |
| H01L 23/31 | (2006.01) |
| H01L 21/312 | (2006.01) |
| H01L 21/3105 | (2006.01) |
| H01L 29/34 | (2006.01) |
| H01L 29/32 | (2006.01) |
| H01L 21/66 | (2006.01) |

(52) U.S. Cl.
CPC .......... *H01L 21/302* (2013.01); *H01L 23/3171* (2013.01); *H01L 21/312* (2013.01); *H01L 21/31058* (2013.01); *H01L 23/3178* (2013.01); *H01L 29/34* (2013.01); *H01L 29/32* (2013.01); *H01L 22/12* (2013.01); *H01L 22/20* (2013.01)

(58) Field of Classification Search
None
See application file for complete search history.

(56) References Cited

U.S. PATENT DOCUMENTS

| | | | |
|---|---|---|---|
| 5,960,260 A | 9/1999 | Umehara et al. | |
| 6,087,191 A * | 7/2000 | Boggs | 438/12 |
| 6,118,183 A | 9/2000 | Umehara et al. | |
| 6,175,162 B1 | 1/2001 | Kao et al. | |
| 6,235,387 B1 | 5/2001 | Bennett et al. | |
| 6,562,658 B2 | 5/2003 | Ohuchi et al. | |
| 6,940,181 B2 | 9/2005 | Derderian et al. | |
| 7,358,158 B2 | 4/2008 | Aihara et al. | |
| 7,427,811 B2 | 9/2008 | Derderian et al. | |
| 7,723,211 B2 | 5/2010 | Yamamoto et al. | |
| 8,048,690 B2 | 11/2011 | Terada et al. | |
| 2003/0139838 A1* | 7/2003 | Marella | 700/110 |
| 2006/0237822 A1* | 10/2006 | Derderian et al. | 257/643 |

* cited by examiner

*Primary Examiner* — Hoang-Quan Ho
(74) *Attorney, Agent, or Firm* — David A. Cain; Hoffman Warnick LLC

(57) ABSTRACT

Aspects of the disclosure provide a method of inhibiting crack propagation in a silicon wafer. In one embodiment, a method of repairing an imperfection on a surface of a semiconductor device is disclosed. The method includes: screening for imperfections on a surface of a silicon wafer of a semiconductor device; and in response to at least one imperfection on the surface of the silicon wafer, depositing a material on the surface of the silicon wafer.

9 Claims, 5 Drawing Sheets

INHIBITING PROPAGATION OF IMPERFECTIONS IN SEMICONDUCTOR DEVICES

FIELD OF THE INVENTION

The disclosure relates generally to semiconductor devices, and more particularly, to a method of repairing imperfections in silicon wafers to inhibit propagation of the imperfections.

BACKGROUND

During module final tests, yield losses can be due to silicon imperfections (i.e., cracks, dings, nicks, pits, scratches, etc.) on the backside of the wafer or die. These silicon imperfections start at the surface of the backside, but also extend further into the silicon and into the functional circuitry. However, some imperfections on the surface of the silicon do not extend into the functional circuitry. These imperfections are a concern because, although these imperfections are only at the surface during the module final testing stage, temperature cycling during operation can propagate the imperfections into the functional circuitry.

Backside grinding (BSG) is a method to remove these surface imperfections by grinding down the thickness of the silicon wafer. However, in flip chip technologies, or other technologies where the entire thickness of the silicon wafer is desired, BSG is not a viable method to remove the surface imperfections of the silicon wafer.

BRIEF SUMMARY

Aspects of the disclosure provide a method of inhibiting crack propagation in a silicon wafer. In one embodiment, a method of repairing an imperfection on a surface of a semiconductor device is disclosed. The method includes: screening for imperfections on a surface of a silicon wafer of a semiconductor device; and in response to at least one imperfection on the surface of the silicon wafer, depositing a material on the surface of the silicon wafer.

A first aspect of the disclosure provides a method of repairing an imperfection on a surface of a semiconductor device, comprising: screening for imperfections on a surface of a silicon wafer of a semiconductor device; and in response to at least one imperfection on the surface of the silicon wafer, depositing a material on the surface of the silicon wafer.

A second aspect of the disclosure provides a method of repairing an imperfection on a surface of a semiconductor device and inhibiting propagation of the imperfection, comprising: screening for imperfections on a surface of a silicon wafer of a semiconductor device; and in response to at least one imperfection on the surface of the silicon wafer, depositing an organic epoxy into the at least one imperfection to adhere adjacent surfaces of the at least one imperfection together.

A third aspect of the disclosure provides a silicon wafer, comprising: an active region; and an inactive region above the active region, the inactive region including at least one imperfection, wherein the at least one imperfection is filled with a material to adhere adjacent surfaces together.

BRIEF DESCRIPTION OF THE DRAWINGS

The above and other aspects, features and advantages of the disclosure will be better understood by reading the following more particular description of the disclosure in conjunction with the accompanying drawings.

Figure 1:
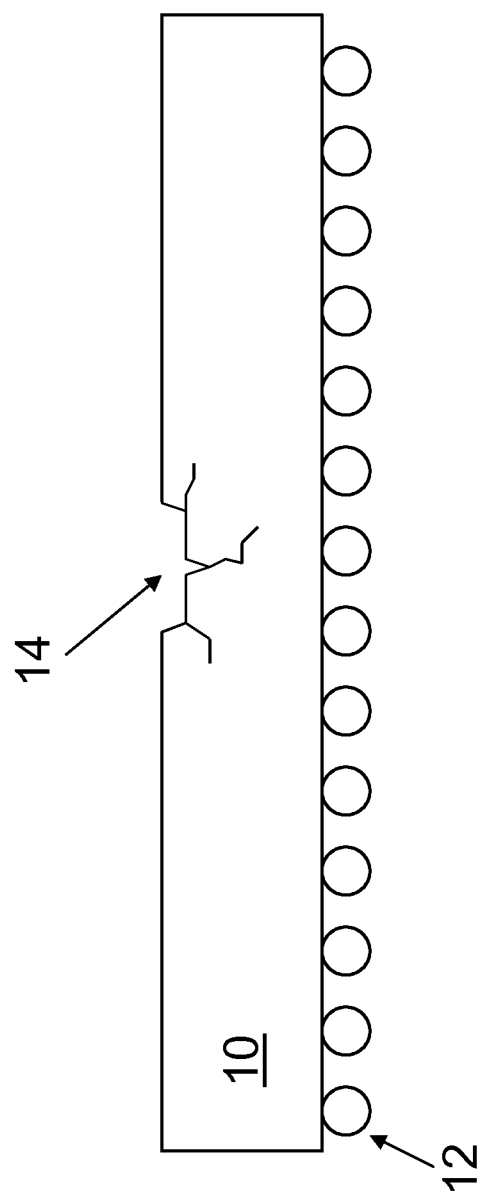
FIG. 1 shows a partial cross-sectional view of a silicon wafer according to embodiments of the invention.

The drawings are not necessarily to scale. The drawings are merely schematic representations, not intended to portray specific parameters of the disclosure. The drawings are intended to depict only typical embodiments of the disclosure, and therefore should not be considered as limiting the scope of the disclosure. In the drawings, like numbering represents like elements.

DETAILED DESCRIPTION

As mentioned above, this disclosure relates generally to semiconductor devices, and more particularly, to a method of repairing imperfections in silicon wafers to inhibit propagation of the imperfection.

During module final tests, yield losses can be due to silicon imperfections (i.e., cracks, dings, nicks, pits, scratches, etc.) on the backside of the wafer or die. These silicon imperfections start at the surface of the backside, but also extend further into the silicon and into the functional circuitry. However, some imperfections on the surface of the silicon do not extend into the functional circuitry. These imperfections are a concern because, although these imperfections are only at the surface (i.e., the inactive region) during the module final testing stage, temperature cycling during operation can propagate the imperfections into the functional circuitry (i.e., the active region).

To remove surface imperfections in the inactive region of the silicon wafers, backside grinding (BSG) grinds down the thickness of the silicon wafer. However, in flip chip technologies, or other technologies where the entire thickness of the silicon wafer is desired, BSG is not a viable method to remove the surface imperfections of the silicon wafer. Therefore, it is desired to repair the imperfection in the surface of the silicon wafer, in order to prevent the imperfection from propagating to the active region of the silicon wafer.

Figure 2:
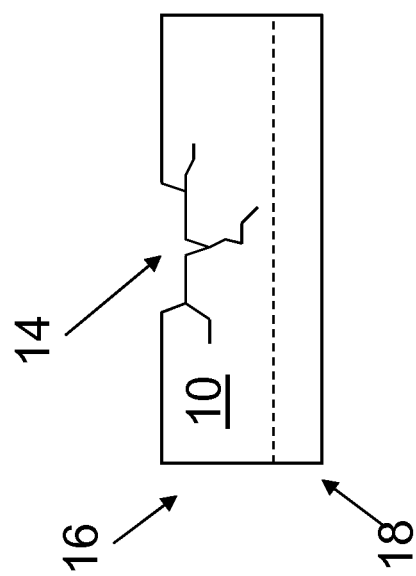
FIG. 2 shows a partial cross-sectional view of a silicon wafer according to embodiments of the invention.

Turning now to FIG. 1, a partial cross-sectional view of a silicon wafer 10 according to embodiments of the invention are shown. Silicon wafer 10 may include a plurality of solder balls 12 that are used to join silicon wafer 10 to a substrate (not shown). Silicon wafer 10 may include at least one imperfection 14 on a surface of the silicon wafer 10. As seen in FIG. 2, the at least one imperfection 14 is on the inactive region 16 of the silicon wafer. That is, the at least one imperfection 14 has not propagated through to the active region 18 (functional circuitry).

However, later on, when the device is in use (i.e., when the silicon wafer 10 is joined to a substrate (not shown)), the imperfections 14 that previously only existed in the inactive region 16 of the silicon wafer 10 may propagate to the active region 18 and cause the device to fail. This is because the silicon wafer 10 and the substrate (not shown) have different coefficients of expansion. The coefficient of expansion for the substrate (not shown) is much larger than the coefficient of expansion of the silicon wafer 10, so during the temperature cycling, the device will bend and the imperfections propagate.

It is understood that imperfections 14 may also occur after a substrate (not shown) is attached to the silicon 10. For example, an imperfection 14 may result in the silicon 10 due to picking (the manufacturing operation where the individual die is placed on the substrate) and a burr or sharp edge of the pick-up head imparted an imperfection 14 on the silicon 10.

Aspects of the disclosure provide a method of inhibiting crack propagation in a silicon wafer. In one embodiment, a method of repairing an imperfection on a surface of a semiconductor device includes: manufacturing a plurality of semiconductor devices, each semiconductor device including a silicon wafer; screening each semiconductor device for imperfections on a surface of the silicon wafer; and in response to at least one imperfection on the surface of the silicon wafer, depositing a material on the surface of the silicon wafer. The material is an organic epoxy that joins the adjacent surfaces of the imperfection together, such that the imperfection does not propagate into the active region of the silicon wafer.

Figure 5:
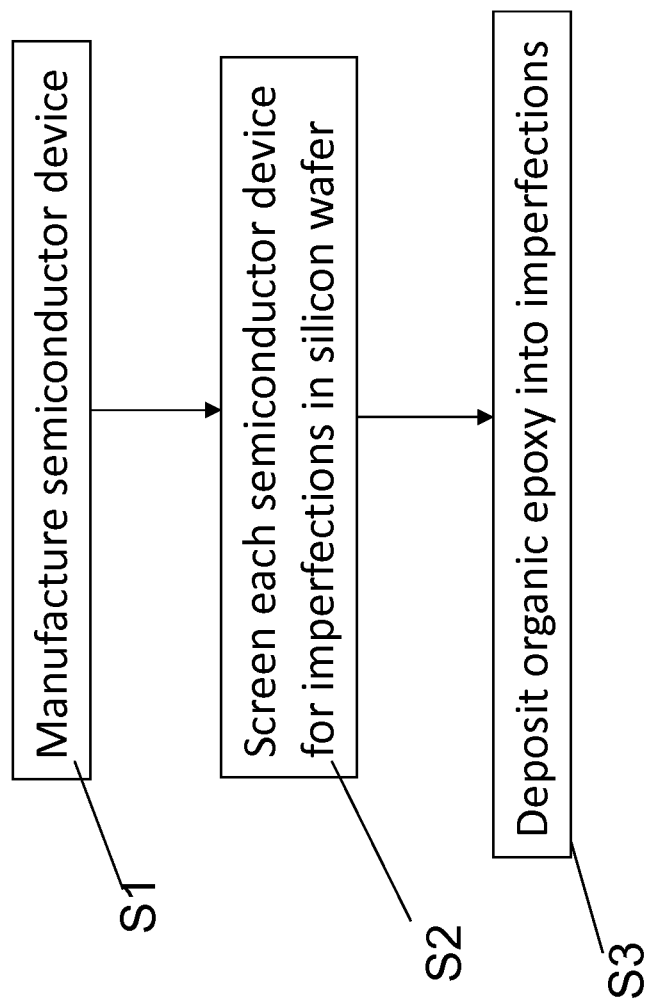
FIG. 5 shows a flow diagram of a method according to embodiments of the invention.

Turning now to FIG. 5, with regard to FIG. 2, a flow diagram of a method of repairing an imperfection on a surface of a silicon wafer 10 (FIG. 1) according to embodiments of the invention is shown. First, at S1, a plurality of semiconductor devices are manufactured. Each semiconductor device includes a silicon wafer 10 (FIG. 1). At S2, each semiconductor device (i.e., silicon wafer 10) is screened for imperfections on the surface of the silicon wafer 10. Imperfections include, but are not limited to, cracks, dings, nicks, pits, scratches, and the like. As mentioned above with respect to FIG. 2, each imperfection 14 may be in an inactive region 16 only. Screening techniques include any now known or later developed screening techniques to discover surface imperfections on silicon wafers, such as, but not limited to visual inspections, C-mode scanning acoustic microscopy, or an electrical test.

Figure 3:
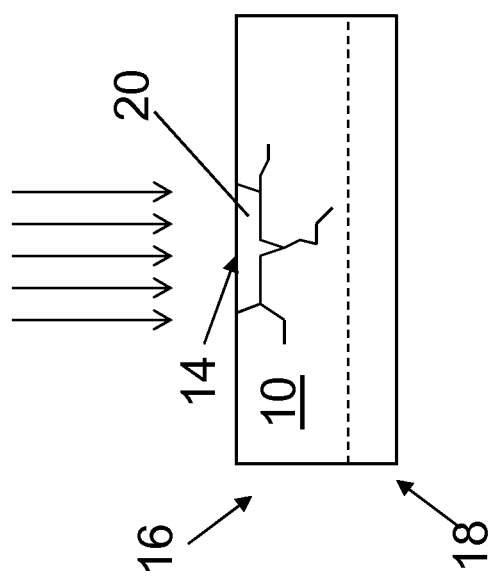
FIG. 3 shows a partial cross-sectional view of a silicon wafer according to embodiments of the invention.
Figure 4:
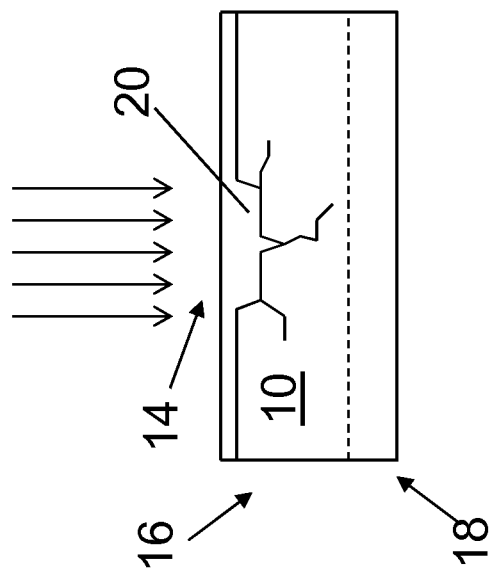
FIG. 4 shows a partial cross-sectional view of a silicon wafer according to embodiments of the invention.

Turning now to FIGS. 3 and 5, at S3, in response to finding at least one imperfection 14 in silicon wafer 10, a material 20 is deposited on the surface of the silicon wafer 10. As shown in FIG. 3, the material 20 may be deposited only in the area of the imperfection 14. However, turning now to FIG. 4, the material 20 may be deposited in the imperfection 14, and the entire surface of silicon wafer 10. In this embodiment, any undetected imperfections are also covered by the material 20.

The material 20 may be an organic epoxy, such as, but not limited (1) a two part system including one of: polyoxypropylenediamine, aliphatic amine, or alkyl phenol, and an epoxy resin; (2) a Loctite type adhesive including at least one of: polyurethane methacrylate resin, hydroxyalkyl methacrylate, alkyl C12 methacrylate, acrylic acid, photoinitiator, gamma-glycidoxypropyl, trimethooxysilane, or tetradecyl methacrylate; or (3) a two part system including one of: nonylphenol or aminoethylpiperazine, and bisphenol A diglycidylether resin. Regardless, the organic epoxy used for material 20 must adhere all adjacent surfaces of the imperfection 14, such that, during operation of the semiconductor device (not shown) including the silicon wafer 10, the imperfection 14 does not propagate into the active region 18 of the silicon wafer 10.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method of repairing an imperfection on a surface of a semiconductor device, comprising:
   detecting imperfections on a surface of a silicon wafer of a semiconductor device; and
   in response to at least one imperfection being detected on the surface of the silicon wafer, depositing a material only within each detected imperfection, wherein the material includes an organic epoxy, the organic epoxy comprising a two-part system selected from the group consisting of: polyoxypropylenediamine, aliphatic amine, or alkyl phenol, and an epoxy resin; and nonylphenol or aminoethylpiperazine, and bisphenol A diglycidylether resin.

2. The method of claim 1, wherein screening includes one of: a visual inspection, a C-mode scanning acoustic microscopy, or an electrical test.

3. The method of claim 1, wherein the at least one imperfection includes a crack on the surface of the silicon wafer.

4. The method of claim 3, wherein the crack on the surface of the silicon wafer only extends into an inactive region.

5. A method of repairing an imperfection on a surface of a semiconductor device and inhibiting propagation of the imperfection, comprising:
   detecting imperfections on a surface of a silicon wafer of a semiconductor device; and
   in response to at least one imperfection being detected on the surface of the silicon wafer, depositing a material only within each detected imperfection to adhere adjacent surfaces of each detected imperfection together, wherein the material includes an organic epoxy, the organic epoxy comprising a two-part system selected from the group consisting of: polyoxypropylenediamine, aliphatic amine, or alkyl phenol, and an epoxy resin; and nonylphenol or aminoethylpiperazine, and bisphenol A diglycidylether resin.

6. The method of claim 5, wherein screening includes one of: a visual inspection, a C-mode scanning acoustic microscopy, or an electrical test.

7. The method of claim 5, wherein the at least one imperfection includes a crack on the surface of the silicon wafer.

8. The method of claim 7, wherein the crack on the surface of the silicon wafer only extends into an inactive region of the silicon wafer.

9. The method of claim 8, wherein the deposition of the material inhibits the crack from propagating into an active region of the silicon wafer.

\* \* \* \* \*